(12) United States Patent
Miida

(10) Patent No.: US 8,334,164 B2
(45) Date of Patent: Dec. 18, 2012

(54) IMAGE SENSOR AND FABRICATION METHOD THEREOF

(75) Inventor: Takashi Miida, Hsin-Chu (TW)

(73) Assignee: Powerchip Technology Corporation, Hsinchu Science Park, Hsinchu (TW)

( * ) Notice: Subject to any disclaimer, the term of this patent is extended or adjusted under 35 U.S.C. 154(b) by 459 days.

(21) Appl. No.: 12/691,704

(22) Filed: Jan. 21, 2010

(65) Prior Publication Data

US 2010/0120193 A1 May 13, 2010

Related U.S. Application Data

(62) Division of application No. 11/465,815, filed on Aug. 21, 2006, now Pat. No. 7,679,157.

(51) Int. Cl.
*H01L 21/00* (2006.01)

(52) U.S. Cl. .......................................... 438/73; 438/68
(58) Field of Classification Search .................. 438/66, 438/73
See application file for complete search history.

(56) References Cited

U.S. PATENT DOCUMENTS

| | | | |
|---|---|---|---|
| 6,018,187 A | 1/2000 | Theil | |
| 2002/0151121 A1* | 10/2002 | Tanaka | 438/166 |
| 2005/0179063 A1 | 8/2005 | Yaung | |

\* cited by examiner

*Primary Examiner* — Bradley K Smith
(74) *Attorney, Agent, or Firm* — Winston Hsu; Scott Margo

(57) ABSTRACT

An image sensor has a substrate, a dielectric layer positioned on the substrate, a pixel array including a plurality of pixels defined on the substrate, a shield electrode positioned between any two adjacent pixel electrodes of the pixels, a photo conductive layer positioned on the shield electrode and the pixel electrodes, and a transparent conductive layer covering the photo conductive layer.

10 Claims, 16 Drawing Sheets

IMAGE SENSOR AND FABRICATION METHOD THEREOF

CROSS REFERENCE TO RELATED APPLICATIONS

This is a division of U.S. application Ser. No. 11/465,815 filed Aug. 21, 2006, which is entirely incorporated herein by reference.

BACKGROUND OF THE INVENTION

1. Field of the Invention

The present invention relates to an image sensor, and more particularly, to an image sensor with a shield electrode for solving carrier cross-talk problems.

2. Description of the Prior Art

The image sensor such as complementary metal oxide semiconductors (CMOS) or charge coupled device (CCD) is a silicon semiconductor device designed to capture photons (light) and convert them into electrons. Electrons, once converted, must then be transferred and converted again to voltage which can be measured and turned into digital data. The hydrogenated amorphous silicon ($\alpha$-Si:H) based image sensor stacking on CCD or CMOS elements has been studied to pursue the advantages over the conventional CCD or CMOS image sensor as below. The high fill factor brought by its stacking structure will provide the full of pixel area to be available for photo sensing, thereby achieving the high quantum efficiency in conjunction with the direct energy transition of $\alpha$-Si:H material. However, this type of sensor has been suffered by cross-talk, image lag, and dark leakage signal problems in the past study. In particular, the problem of carrier cross-talk across adjacent pixels causes the serious resolution and uniformity degradation at the photo response, also brings the color cross-talk over the pixels that produces the poor color fidelity. Besides, the image lag problem is mostly caused by low carrier velocity due to its deep traps or field emission based carrier transportation mechanism through the $\alpha$-Si:H material, in which the image tailing appears from the bright spot over the frames in the motion picture. In particular, it is impossible to reproduce the color fidelity at low signal level when the sample having an image lag problem, since the full amount of signal from a pixel can not be read out in just one shot frame. Finally, the dark leakage problem is mainly caused by the injection of hole or electron from metal electrodes to the p-type layer (p-layer) or n-type layer (n-layer) of the photo conductive layer by tunneling, which generates the cosmic noise in the dark scene. Thus, these three major problems should be improved to compete with the conventional silicon based CCD or CMOS image sensors for the better picture quality.

The current technology utilizing $\alpha$-Si:H has been developed to comprise with the following materials: 1) the transparent metal such as ITO (Indium Tin Oxide); 2) the heavily boron doped p-layer composed of hydrogenated amorphous silicon carbide ($\alpha$-SiC:H) to collect photo generated holes formed on an intrinsic layer (i-layer) to contact with the ITO; 3) the intrinsic $\alpha$-Si:H layer (i-layer) which is mostly contributed as the photonic electron-hole pairs generation layer, 4) the heavily phosphorus doped n-layer composed of hydrogenated carbon doped amorphous silicon working as the receptor for electrons from i-layer to the metal pixel electrodes; and 5) the metal pixel electrode, under the n-layer connecting to the transistor, and vertically stacked above the CMOS circuitry implemented on a silicon substrate. FIG. 1 shows the band diagram of the p-i-n hetero junction structure having an i-layer/n-layer interface as described above. The charge to voltage conversion gain is mainly determined by the sensing capacitance in which it can be minimized by the thickening i-layer.

For achieving the higher quantum efficiency in the $\alpha$-Si:H based i-layer, the photo-conductivity and light absorption should be improved with longer minority carrier lifetime and higher carrier mobility for large depth by optimizing hydrogen content. Meanwhile, the heavily boron doped p-layer under the ITO layer can be changed to a $CH_4$ based $\alpha$-SiC:H layer forming the hetero junction with the $\alpha$-Si:H based i-layer. It is effective to enhance the transparency due to the larger optical band gap (Eopt) of SiC, also to prevent the electron emission by tunneling effect from the ITO layer to the p-layer by widening the energy band gap for the dark leakage suppression. Furthermore, the $\alpha$-SiC:H material is also applicable for the n-layer to avoid the lateral carrier cross-talk across the pixels by reducing the conductivity of the n-layer between the pixel electrodes. Also it is effective to block the hole emission from the pixel electrodes formed with titanium nitride (TiN) to the n-layer as the same case as the electron tunneling to the p-layer. However, the $\alpha$-SiC material brings the dark signal and image lag problems caused by its high density of deep traps.

Furthermore, there occurs a more serious problem at the pixel electrode corners have a boundary with the n-layer since the electric field strength is locally concentrated to bend the energy band at the pointed edge as shown in FIG. 2, wherein the transition probability of holes by tunneling becomes higher to increase the dark leakage current at the reversed biased condition. Besides, the n-layer composed of $\alpha$-SiC is also effective for adhesion on pixel electrode formed with TiN without peeling-off, which is also occurred at the pointed electrode corner by the tensile force. However, the stressed $\alpha$-SiC film on the corners of the pixel electrode may have high density of traps to cause the pixel defects as well as the image lag worse, as shown in FIG. 2.

Referring to FIGS. 3(a)-4, FIG. 3(a) is a cross-sectional schematic diagram of an image sensor utilizing stacked p-i-n layer structure according to the prior art, FIG. 3(b) is a proposed equivalent circuitry of the image sensor of FIG. 3(a), and FIG. 4 is a schematic band diagram of the pixel electrode and pixel electrode gap shown in FIG. 3(a). The prior-art image sensor 10 comprises a plurality of pixel circuits (not shown) and an isolation film 24 on a substrate (not shown), a plurality of pixel electrodes 12 on the pixel circuits and the isolation film 24, a photo conductive layer 14 on the pixel electrodes 12, and a transparent electrode 16 on the photo conductive layer 14, wherein the photo conductive layer 14 comprises an n-layer 18, an i-layer 20, and a p-layer 22 from bottom to top, which constitute so-called stacked p-i-n layer structure.

The photoconductive layer 14 is introduced in conjunction with four capacitive components such as $C_{pd}$, $C_{sub}$, $C_1$ and $C_2$. These capacitive components are oriented from the node point at the n/i-layer interface in the middle of the pixel electrode gap as shown in FIG. 3(a). Here, $C_{pd}$ is represented as the capacitance component for the transparent electrode 16, formed with indium tin oxide (ITO), $C_{sub}$ is represented as the capacitance component for the p-type silicon substrate (not shown) through silicon oxide ($SiO_2$) based isolation films 24, while $C_1$ and $C_2$ are coupled with the adjacent metal pixel electrodes 12, respectively. This device structure of the prior-art image sensor 10 can be assumed as the flipped n-channel metal insulator semiconductor field effect transistor (MISFET) 30 where both the source and the drain are connected to two pixel electrodes 12 individually, as shown in FIG. 3(b), while the substrate bias is supplied from the transparent electrode 16 to the p-layer 22, and then the silicon substrate at the grounded level will be regarded as the gate of the assumed MISFET device 30 having the gate capacitance of $C_{sub}$.

Since the $C_{pd}$ and $C_{sub}$ would be not large enough to compare with $C_1$ or $C_2$ due to their aspect ratios in the actual device structure, the potential distribution between the adjacent pixel electrodes 12 is strongly modulated with the bias voltage, which is near power supply voltage level applied on the adjacent pixel electrodes, by the lateral 2-dimensional effect. Therefore, the channel potential profile of the flipped MOSFET 30 is highly pulled up by the coupling through $C_1$ and $C_2$ from the pixel electrodes 12, while $C_{pd}$ or $C_{sub}$ cannot sustain the potential in the pixel electrode gap region to lower the level. Thus, the electro-static potential barrier height for electrons becomes lower than that of 1-dimensional approximation, thereby generating the cross-talk current across the pixels as shown in FIG. 4.

FIG. 5 shows the energy band diagram of the device structure for both the pixel electrode and the electrode gap region shown in FIG. 3(a) vertically, wherein the electrode gap means the spacing between the adjacent pixel electrodes 12, and the electron channel layer is located at the i-layer 20/n-layer 18 interface. Since materials of i-layer 20 and n-layer 18 have the different energy conduction band levels which form the hetero junction band, the electrons are mostly accumulated and stored at this interface to form the electron channel layer, and photo-generated electrons will be flowed over the n-layer 18 conduction band to the pixel electrodes 12. On the other hand, the horizontal carrier path across the adjacent pixel electrodes 12 will be formed through the i-layer 20/n-layer 18 interface to cause cross-talk effects as previously explained in FIG. 3(a) and FIG. 4. Furthermore, the potential barrier in the pixel electrode gap region is lowered from the 1-dimensional barrier height as shown in FIGS. 4 and 5. Considering from the proposed MISFET model as shown in FIG. 3(b), this cross-talk may be suppressed by thinning i-layer 20 or applying higher voltage on the pixel electrodes 12 to utilize the enhancement of body effect. Although it is obvious that thicker i-layer has rich quantum efficiency, the image sensor with a thicker i-layer has lower immunity for cross-talk due to its weak body effect demonstrated by the potential distribution between the pixel electrode gap region. The sensitivity and the color balance of the prior art image sensor are sacrificed by using a thin i-layer 20, and a higher pixel electrode voltage cannot satisfy the electrical specification for power supply.

SUMMARY OF THE INVENTION

It is therefore a primary objective of the claimed invention to provide an image sensor and the fabrication method thereof to solve the above-mentioned problem.

According to the claimed invention, the image sensor comprises a substrate, and a pixel array comprising a plurality of pixels defined on the substrate. Each of the pixels comprises a pixel circuit formed on the substrate and a pixel electrode positioned on the pixel circuit and electrically connected to the pixel circuit. The image sensor further comprises a shield electrode positioned between any two adjacent pixel electrodes, a photo conductive layer positioned on the shield electrode and the pixel electrodes, and a transparent conductive layer covering the photo conductive layer.

According to the claimed invention, the method of fabricating an image sensor comprises providing a substrate comprising a plurality of pixels and a plurality of pixel circuits thereon, forming a conductive layer on the substrate, performing a first photolithography-etching process (PEP) to remove portions of the conductive layer to form a plurality of pixel electrodes in each pixel and to form a shield electrode between any two adjacent pixel electrodes, forming a photo conductive layer on the pixel electrodes and the shield electrode, and forming a transparent conductive layer covering the photo conductive layer.

It is an advantage of the claimed invention that the shield electrode is formed between the pixel electrodes so that the carrier cross-talk problem can be prevented. Accordingly, the i-layer of the photo conductive layer may be thickened to observe a good sensitivity of the image sensor.

These and other objectives of the present invention will no doubt become obvious to those of ordinary skill in the art after reading the following detailed description of the preferred embodiment that is illustrated in the various figures and drawings.

DETAILED DESCRIPTION

Figure 6:
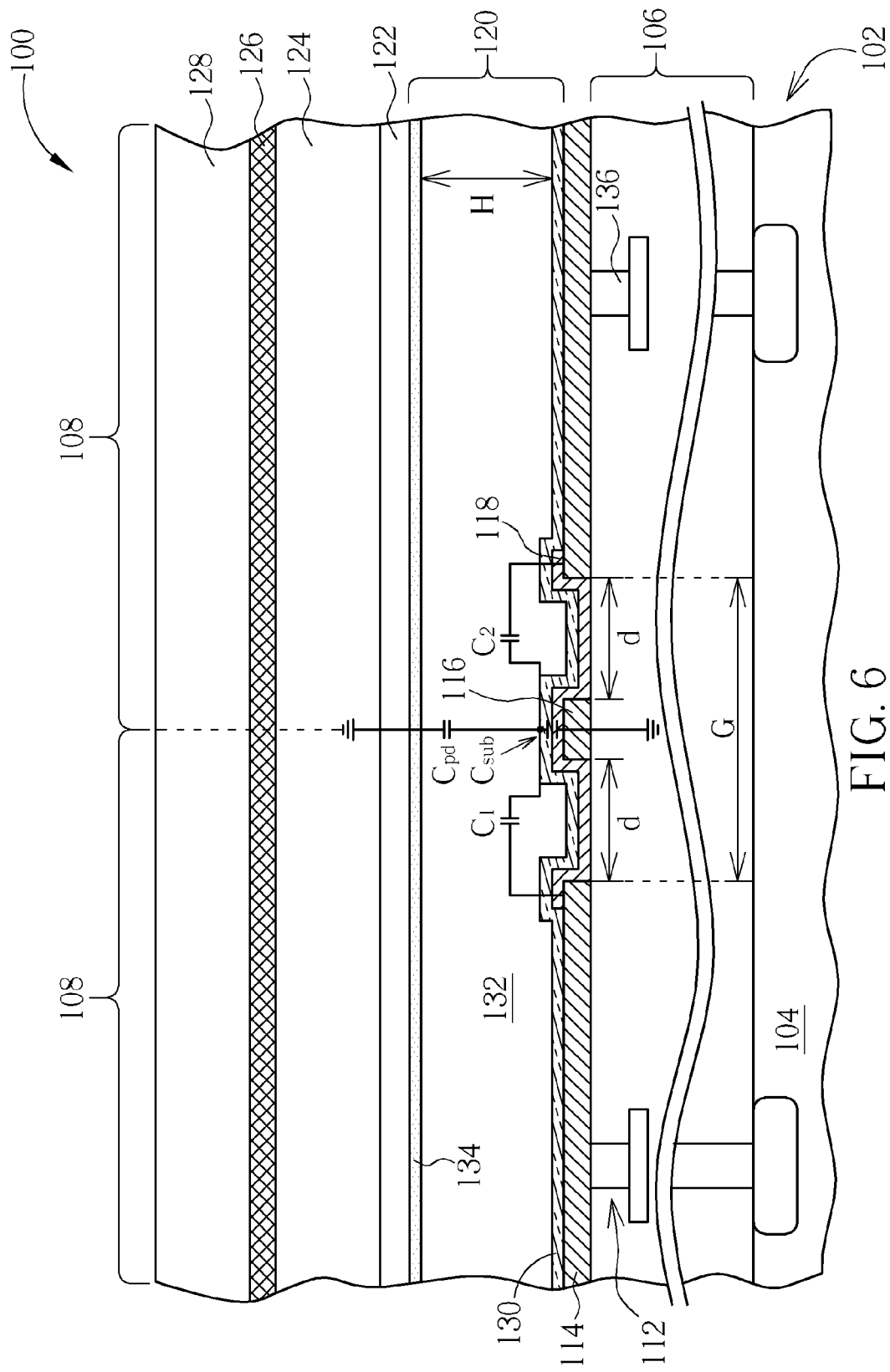
FIG. 6 is a sectional schematic diagram of an image sensor according to the present invention.
Figure 7:
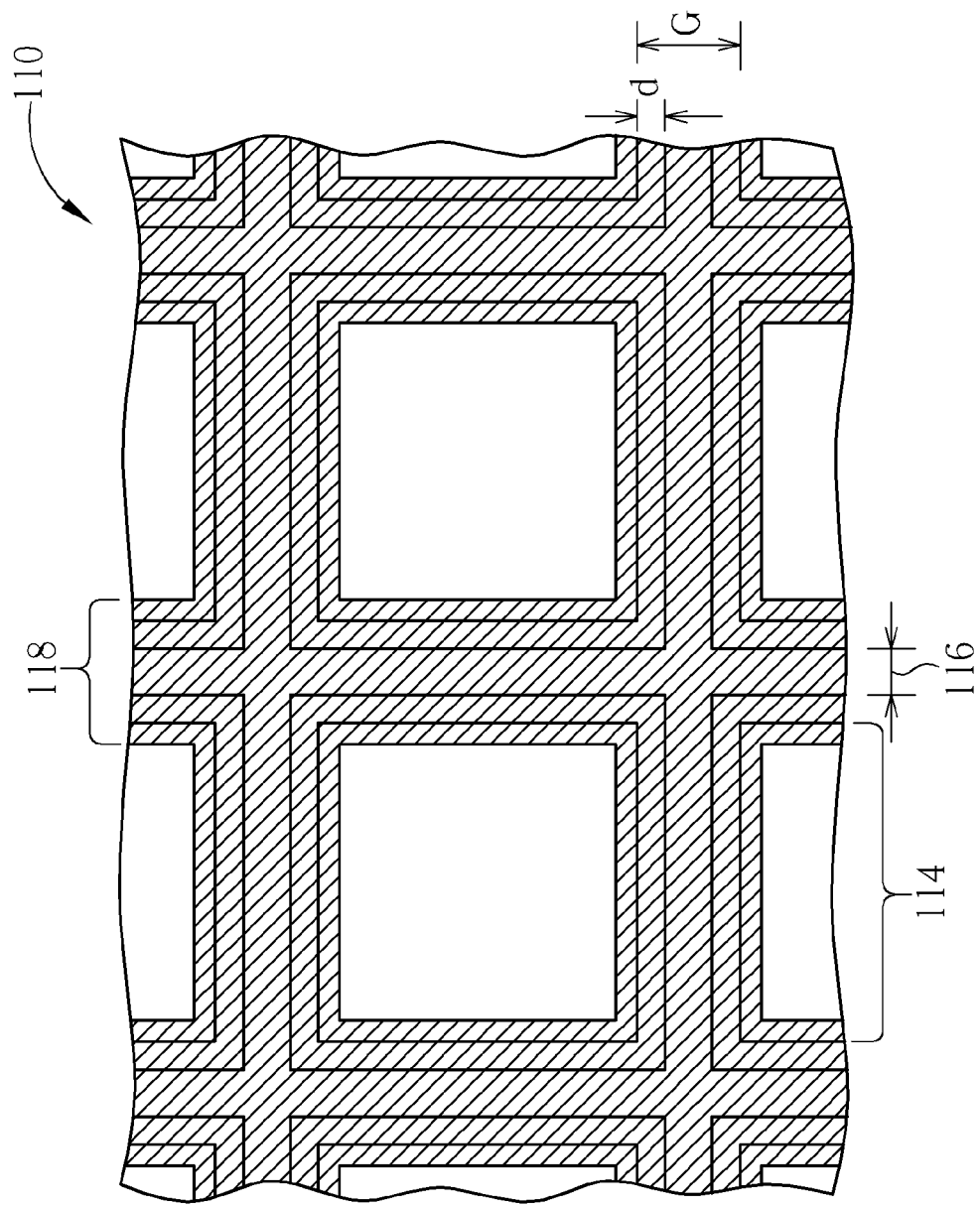
FIG. 7 is a top view layout of a portion of the image sensor shown in FIG. 6.

With reference to FIGS. 6-7, FIG. 6 is a sectional schematic diagram of an image sensor 100 according to the present invention, and FIG. 7 is a top view layout of a portion of the image sensor 100 shown in FIG. 6. The image sensor 100 is a photoconductor-on-active-pixel (POAP) image sensor, and is formed on a semiconductor chip 102 comprising a silicon substrate 104. The image sensor 100 comprises a dielectric layer 106 positioned on the substrate 104 and a plurality of pixels 108 defined on the substrate 104, wherein the pixels 108 are arranged as a pixel array 110, as shown in FIG. 7. Each pixel 108 comprises a pixel circuit 112 positioned in the dielectric layer 106, which may comprise at least a metal-oxide-semiconductor filed effect transistor (MOSFET), and a pixel electrode 114 of the pixel 108. The pixel electrodes 114 comprise metal materials, such as titanium nitride (TiN) and are electrically connected to the corresponding pixel circuits 112 vertically through the via plugs 136. In various embodiments, the pixel electrodes 114 may comprise other conductive materials, such as tungsten (W), aluminum (Al), or copper (Cu). An electrode gap region G represents the spacing between the fringes of the adjacent pixel electrodes 114.

In addition, a shield electrode 116 is positioned in the electrode gap region G and between any two adjacent pixel electrodes 114. The electrode gap region G represents the spacing between the fringes of the adjacent pixel electrodes 114. Therefore, the shield electrode 116 is arranged as a mesh around each pixel electrode 114, as shown in FIG. 7. In a preferable embodiment, the shield electrode 116 is positioned in the middle of the electrode gap region G so that the adjacent pixel electrodes 114 have the same distances d from the shield electrode 116, and the shield electrode 116 is served as the boundary between the pixels 108. Furthermore, the shield electrode 116 may have the same material as that of the pixel electrodes 114, such as TiN, and may be formed together with the pixel electrodes 114 though the same processes. A ground voltage level can be supplied to the shield electrode 116, where the shield electrode 116 has no current path within the pixel area. Here, the shield electrode 116 plays an important role to separate the pixels 108 electrically by lowering the potential level near the surface at the pixel electrode gap region G, while the structure of a conventional image sensor has a large fringing effect across the pixels, which brings the cross-talk current.

According to the present invention, an insulating layer 118 is positioned on the dielectric layer 106, the shield electrode 116, and on the edge portions of the pixel electrodes 114. The insulating layer 118 may be a thin oxide layer (such as silicon oxide, $SiO_2$), which exposes most the central areas of the pixel electrodes 114 so that the pixel electrodes 114 are electrically connected to the photo conductive layer 120 thereon.

The image sensor 100 further comprises a photo conductive layer 120 and a transparent conductive layer 122 covering the insulating layer 118 and the pixel electrodes 114. The photo conductive layer 120 comprises an n-type layer (n-layer) 130, an intrinsic layer (i-layer) 132, and a p-type layer (p-layer) 134 from bottom to top. Wherein, the the i-layer 132 is formed with α-Si:H materials, and the p-layer 134 and the n-layer 130 comprise α-SiC:H materials. For providing good sensitivity and the color balance of the image sensor 100, the i-layer 132 should be thick enough, and may have a thickness H of about 5000 angstroms or more than 5000 angstroms. The transparent conductive layer 122 serves as a top electrode plate that may be formed with indium tin oxide (ITO). In addition, the image sensor 100 may comprise a first planarization layer 124, a color filter layer 126, and a second planarization layer 128 positioned on the photo conductive layer 120 in order, wherein the color filter layer 126 may comprise color filters with different colors, such as red, green, and blue, in different pixels 108.

Figure 4:
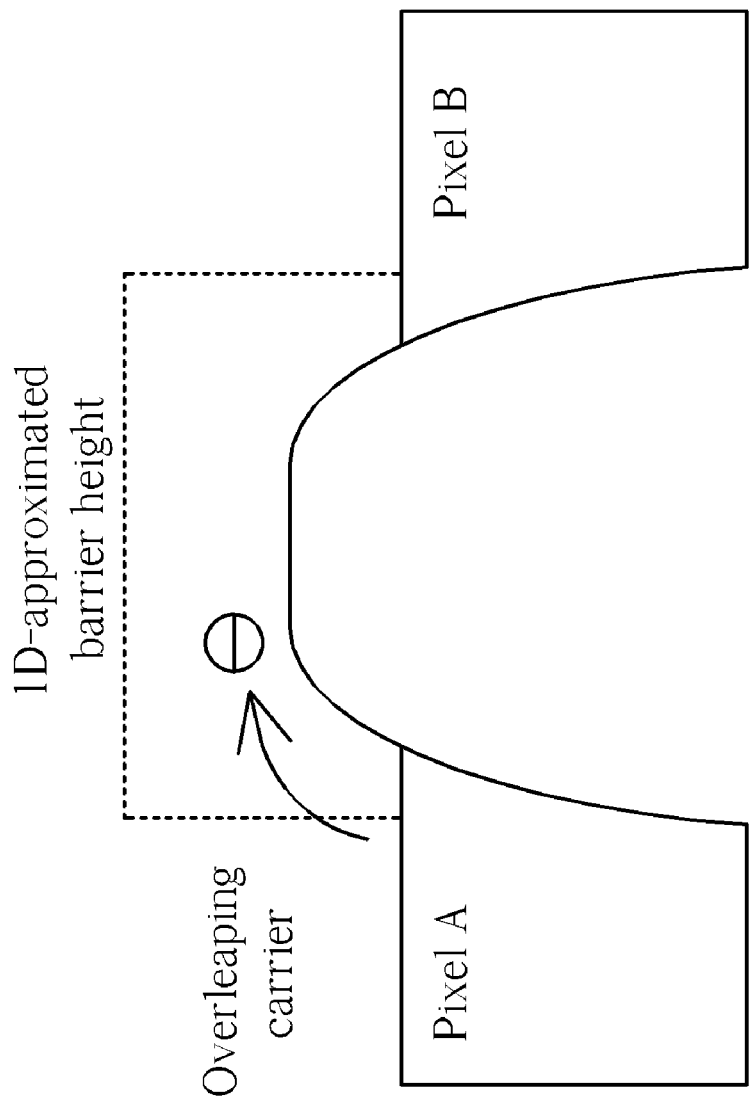
FIG. 4 is a schematic band diagram of the pixel electrode and electrode gap shown in FIG. 3.
Figure 5:
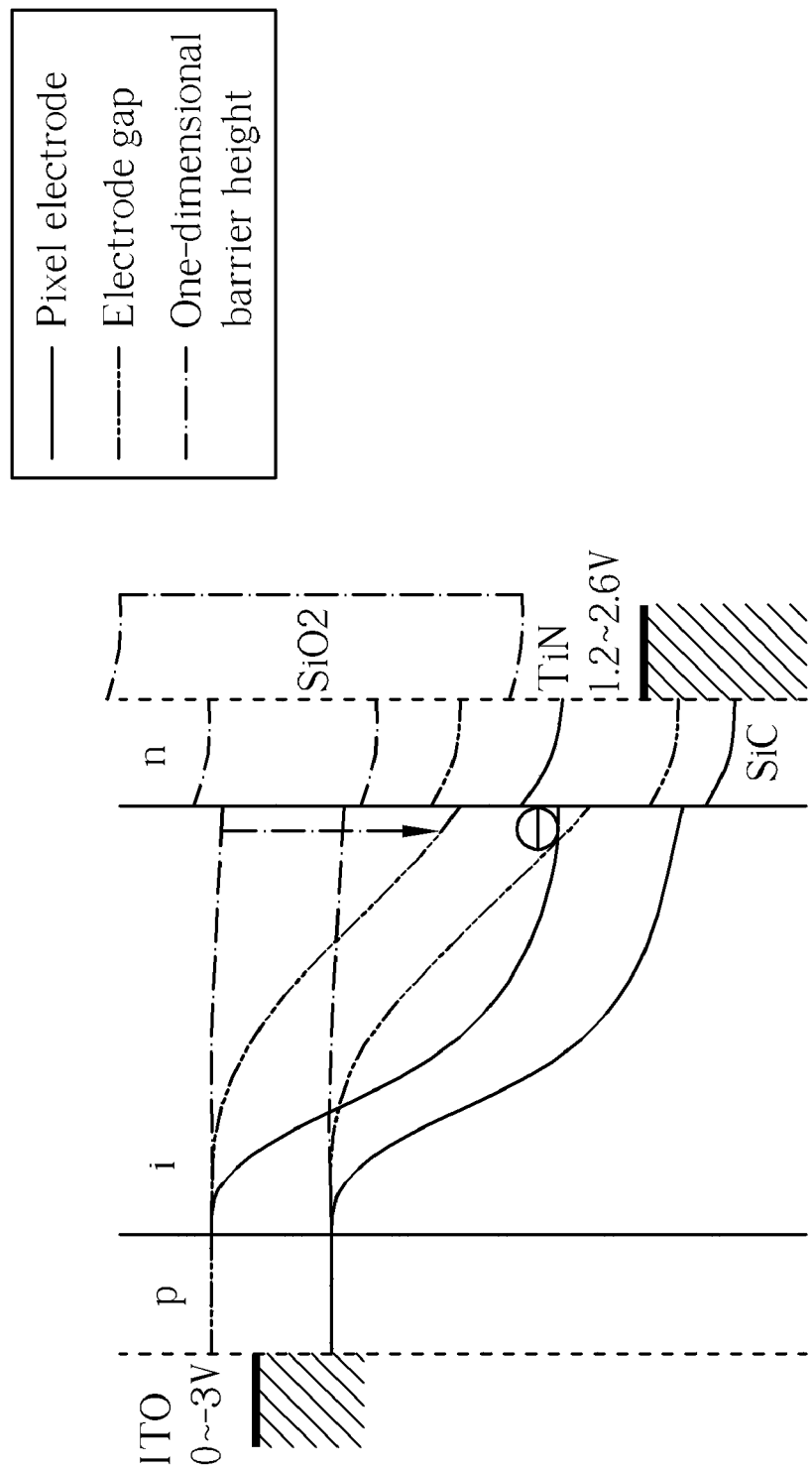
FIG. 5 is an energy band diagram of the device structure show in FIG. 3 for both the pixel electrode and the electrode gap region vertically.

The effect provided by the present invention can be explained with an equivalent circuitry, which is also shown in FIG. 6. Oriented from the node at the i-layer 132/n-layer 130 interface in the middle of the electrode gap region G, the $C_{sub}$ indicates the shield electrode 116 capacitance, the $C_{pd}$ represents the capacitance component for the transparent electrode (ITO) 122, and the $C_1$ and $C_2$ are coupled with the adjacent metal pixel electrodes 114, respectively. Accordingly, the $C_{sub}$ becomes much larger than that of the conventional image sensor structure without the shield electrode 116. Therefore, the shield electrode 116 can strongly force the potential near the surface to a low level and there is 1-dimensional barrier height in the pixel electrode gap region G, thereby preventing the carrier cross-talk over the adjacent pixels occurred in the conventional image sensor as shown in FIG. 4.

Figure 8:
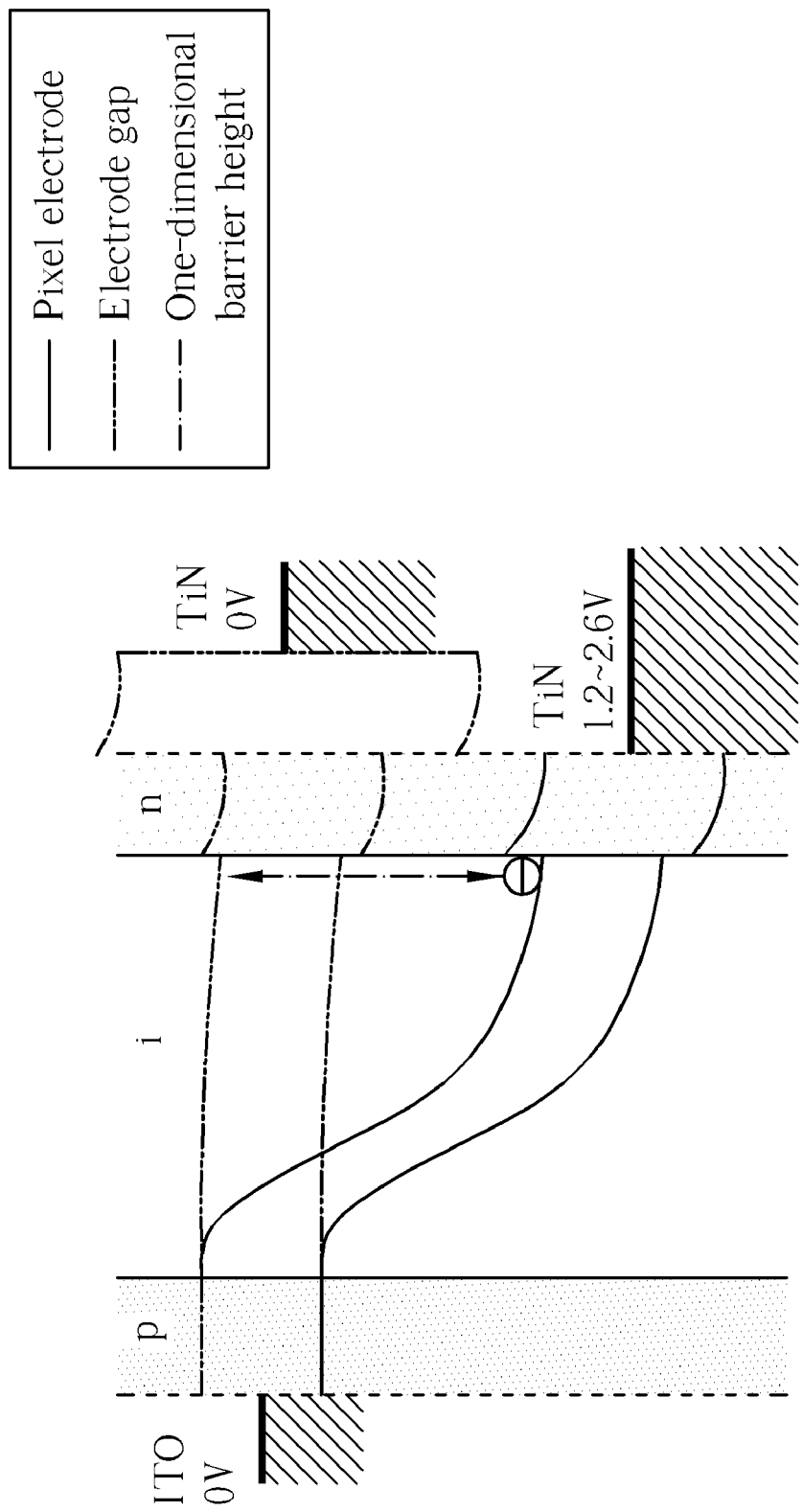
FIG. 8 is an energy band diagram of the image sensor shown in FIG. 6.

FIG. 8 is an energy band diagram of the image sensor 100 shown in FIG. 6 for the adjacent pixel electrodes 114 and the shield electrode 116. Since the potential under the shield electrode 116 is forced to a lower level through the thin insulating layer 118 and the α-SiC based n-layer 130, it is obvious that the cross-talk effect occurred through the i-layer 132/n-layer 130 interface will be cut-off by the large potential barrier height (i.e. 1-dimensional barrier height) in the electrode gap region G. This effect enables to use the thicker i-layer 132 for enhancing the quantum efficiency with the existing bias conditions.

On the other hand, the thickness of the thin insulating layer 118 on the shield electrode 116 may be determined for the potential level at the interface between the α-Si:H based i-layer 132 and the α-SiC:H based n-layer 130, wherein it is preferable to adjusted the thickness of the insulating layer 118 to maximize the gate capacitance ($C_{sub}$). Besides, another role for determining the thickness of the insulating layer 118 is to protect the pointed edge portions of the pixel electrodes 114 to avoid anomaly hole tunneling due to the concentrated electric field, which will cause dark leakages. In addition, it will also contribute to prevent the deep traps in α-SiC:H based n-layer 130 created by the tensile stress that will bring the image lag problem. With reference to FIG. 7, the shield electrode 116 and the edge portions of the pixel electrodes 114 are covered by the insulating layer 118, thus the present invention image sensor 100 structure eliminates the causal root of leakage problem occurred at the edge corners of the pixel electrodes 114 for that there is no longer strong electric fields and tensile stress on the contact region of the α-SiC:H based n-layer 130 and the pixel electrodes 114.

Figure 1:
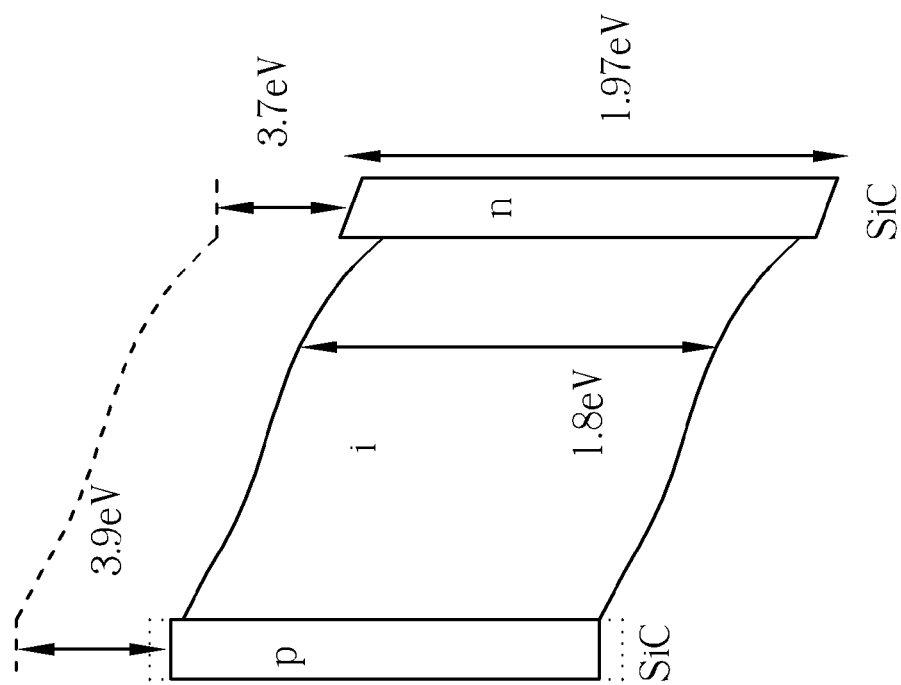
FIG. 1 is a band diagram of the p-i-n hetero junction structure having an α-Si:H(i)/α-SiC:H(n) interface.
Figure 2:
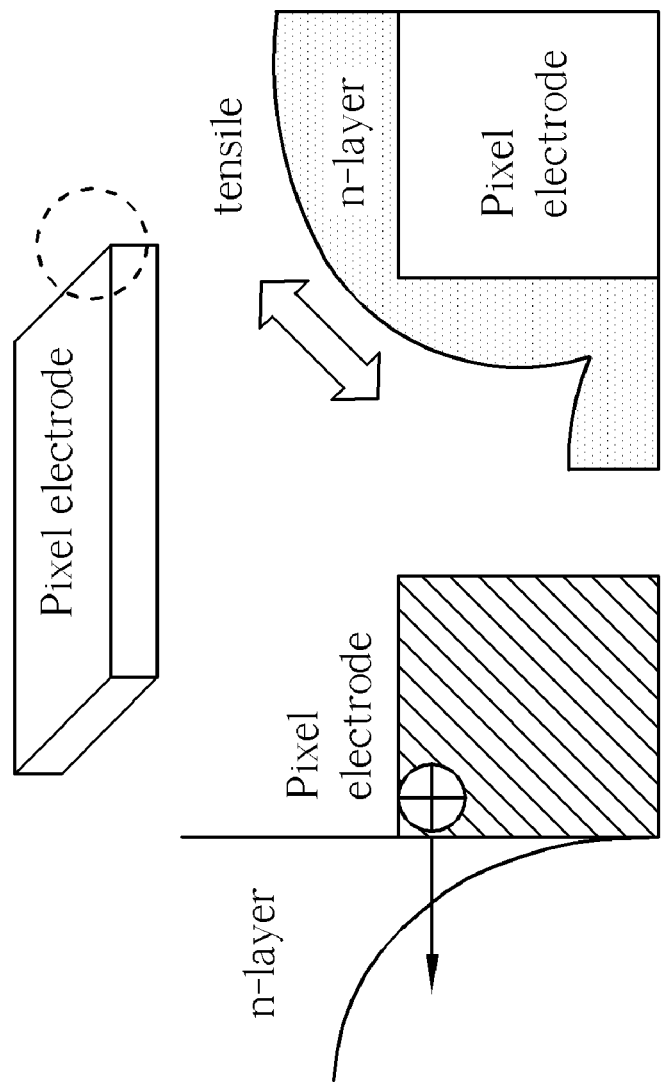
FIG. 2 is a schematic diagram showing the tensile and tunneling problems of the edge corner of the pixel electrode.
Figure 3A:
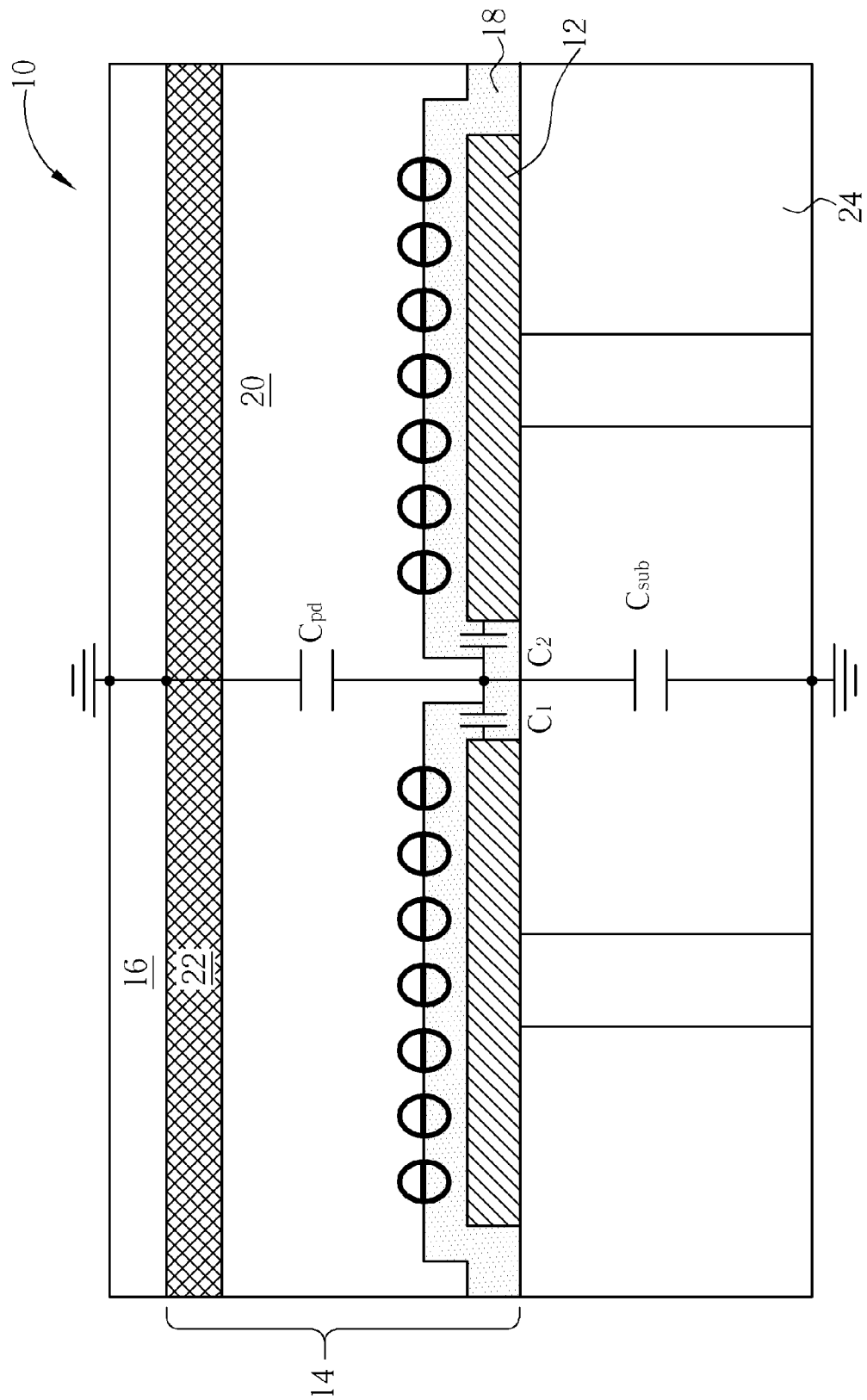
FIG. 3(a) is a cross-sectional schematic diagram of a stacked p-i-n layer structure in pixels of an image sensor according to the prior art.
Figure 3B:
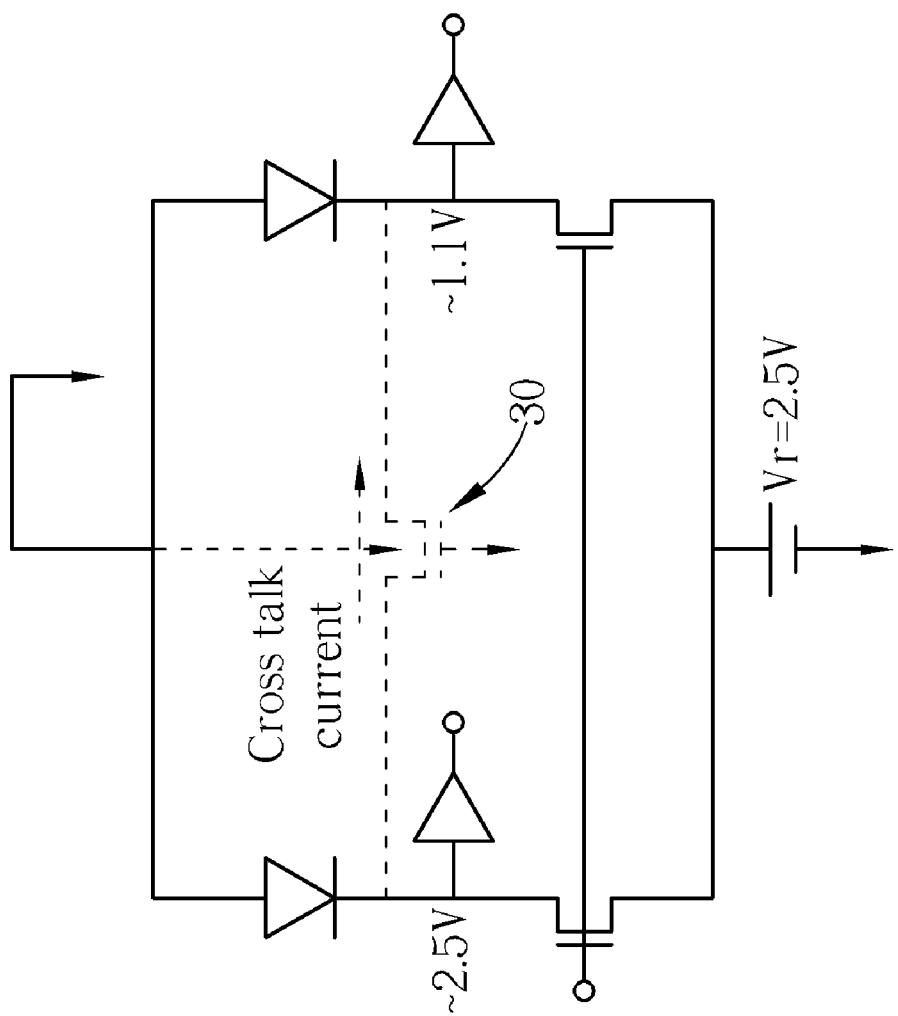
FIG. 3(b) is a proposed equivalent circuitry of the image sensor of FIG. 3(a).
Figure 9:
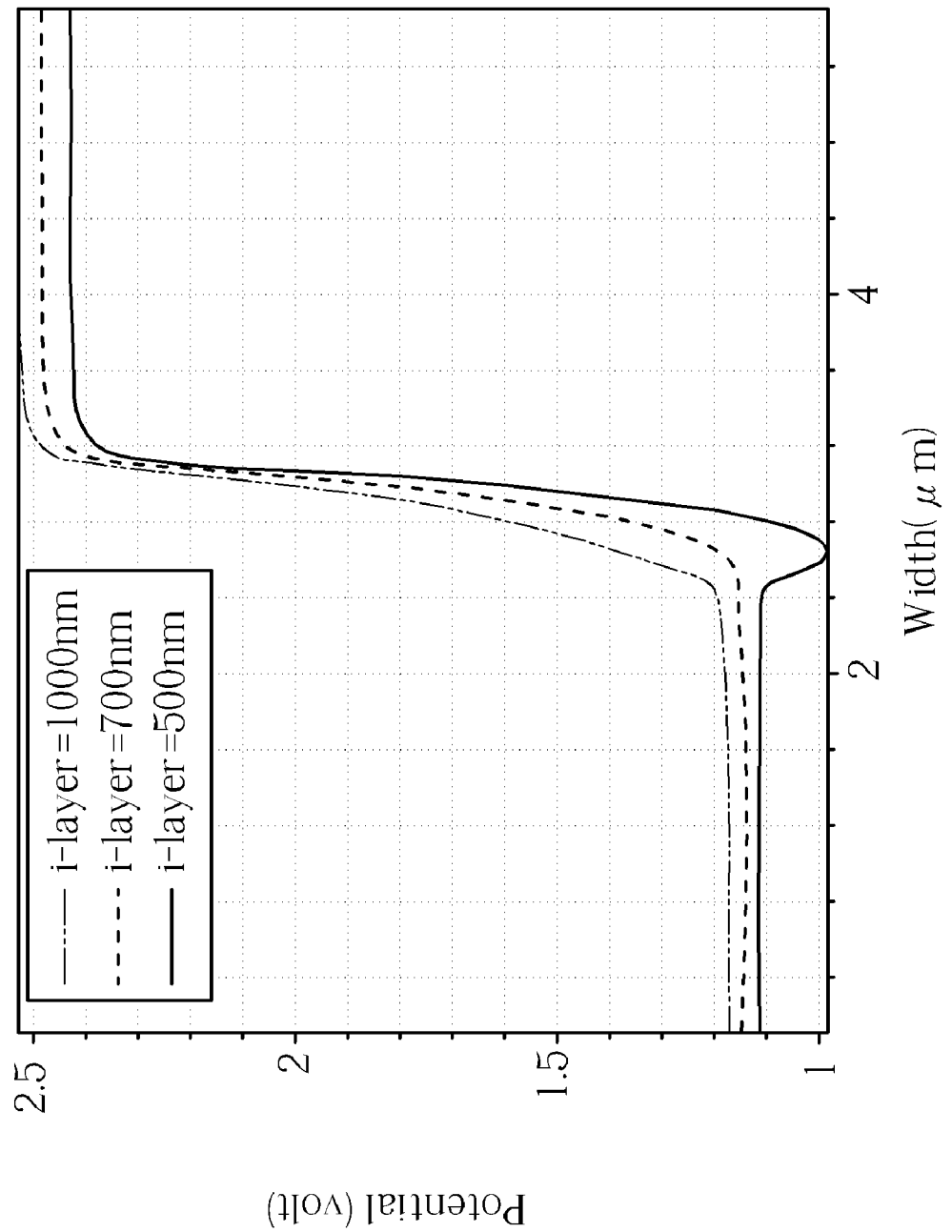
FIG. 9 is a potential diagram of the prior art image sensor of FIG. 3(a).
Figure 10:
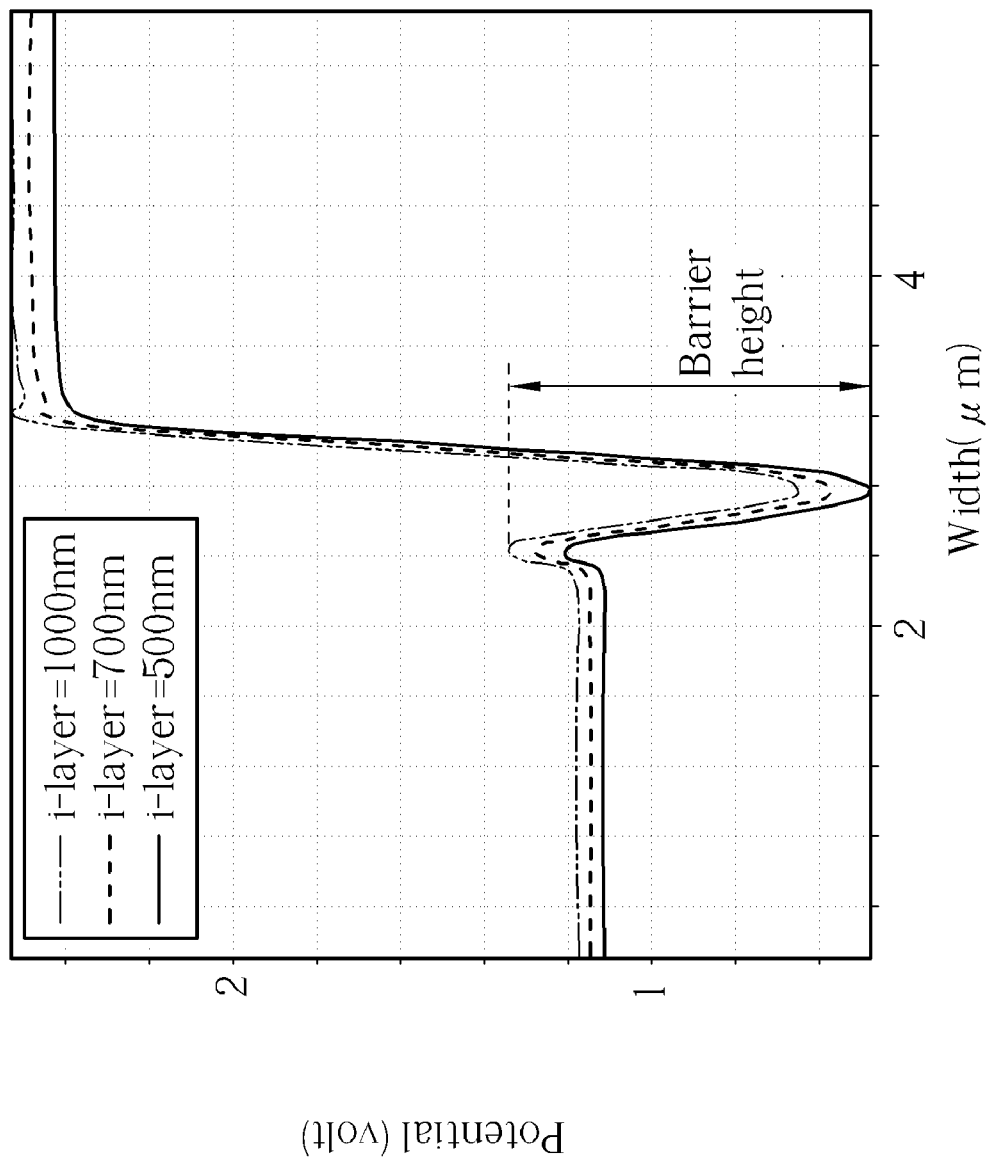
FIG. 10 is a potential diagram of the invention image sensor of FIG. 6.

FIG. 9 is a potential diagram of the prior art image sensor 10 of FIG. 3(a) with the i-layer 20 thickness of 5000 Å, 7000 Å, and 10000 Å. As shown in FIG. 9, the two adjacent pixel electrodes 12 respectively have a potential of 1.2V and 2.6V, and the gap region between the two pixel electrodes 12 has no or small potential barrier height. Therefore, the electrons produced in the i-layer 20 easily move from the right side pixel electrode 12 with high potential to the left side pixel electrode 12 with low potential, which results in the cross-talk problem. Comparatively, FIG. 10 is a potential diagram of the invention image sensor 100 of FIG. 6 with the i-layer 132 thickness of 5000 Å, 7000 Å, and 10000 Å. As shown in FIG. 10, the two adjacent pixel electrodes 114 respectively have a potential of 1.2V and 2.6V, and the gap region G between the two pixel electrodes 114 has a great barrier height. Consequently, the lateral electric field due to the two adjacent pixel electrodes 114 with a potential difference is not so strong, and the shield electrode 116 of the invention image sensor 100 generates a great potential barrier height between the two adjacent pixel electrodes 114 so as to prevent the cross-talk problem. The i-layer having a thickness greater than 5000 Å is applicable in the invention image sensor 100.

Figure 11:
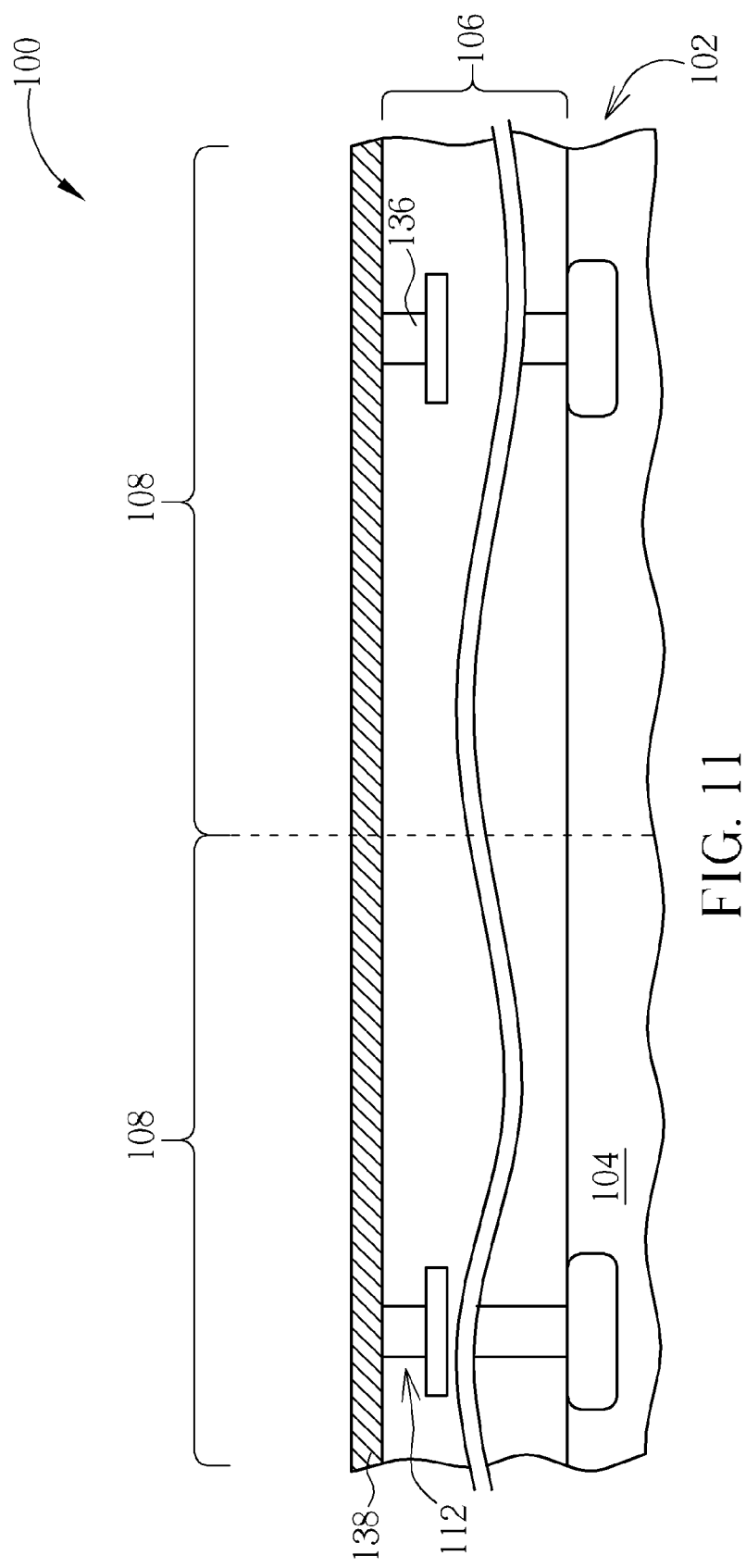
FIGS. 11-15 are fabrication process diagrams of the image sensor according to the present invention.
Figure 12:
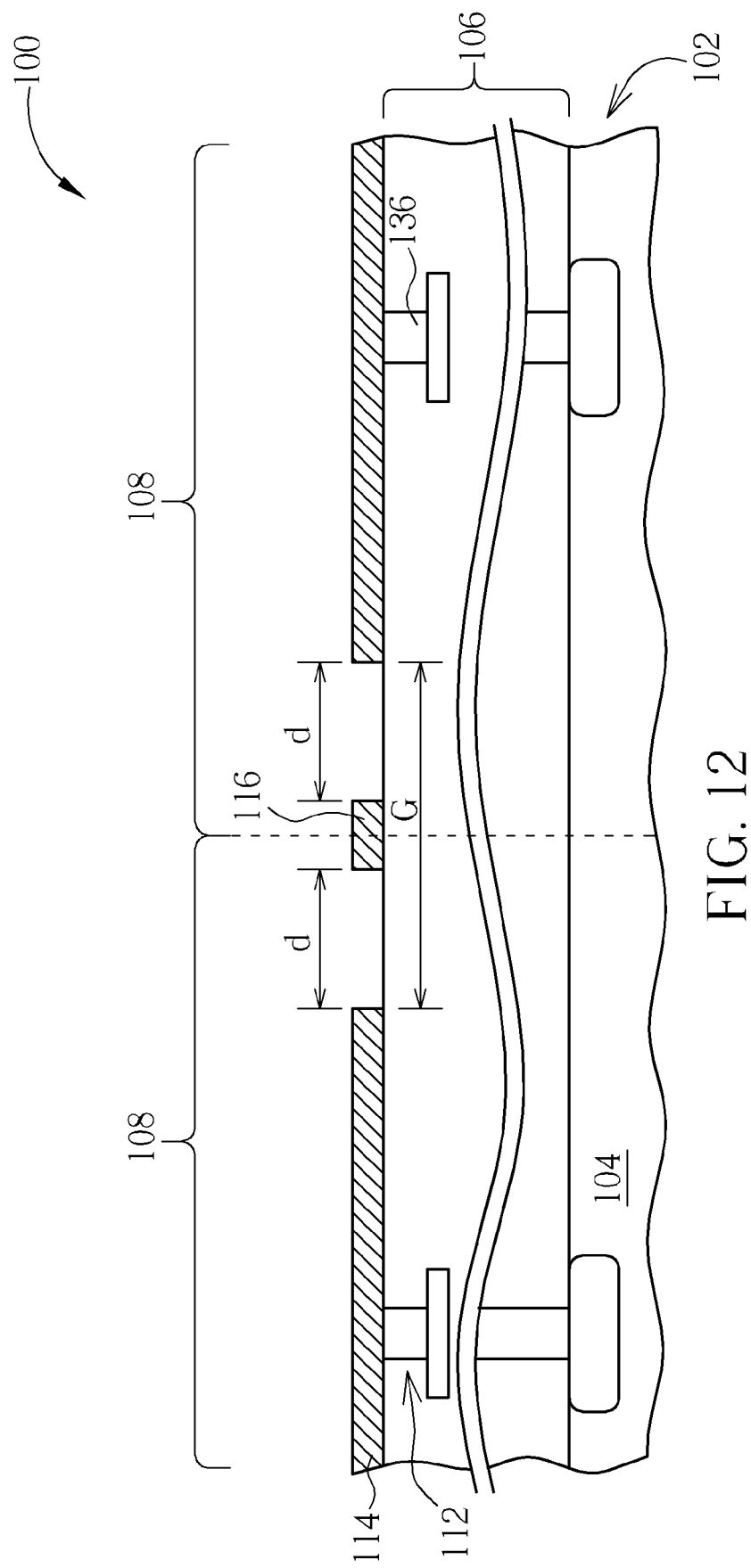

Please refer to FIGS. 11-15, which are fabrication process diagrams of the image sensor 100 according to the present invention. First, as shown in FIG. 11, a semiconductor chip 102 is provided, and the semiconductor chip 102 comprises a silicon substrate 104. Then, a plurality of electric elements is formed on the substrate 104, which forms the pixel circuits 112 in the dielectric layer 106. Thereafter, a conductive layer 138 is formed on the dielectric layer 106, above the pixel circuits 112. The conductive layer 138 may comprise metal materials, preferable TiN and have a thickness about 300 angstroms. With reference to FIG. 12, a photolithography-etching process is performed to remove portions of the conductive layer 138 so as to form a plurality of pixel electrodes 114 in each of the pixels 108 and a shield electrode 116 positioned between the pixel electrodes 114. Therefore, the shield electrode 116 is positioned at the same plane as that of the pixel electrodes 114. In addition, the shield electrode 116 has the same distances to the adjacent pixel electrodes 114. In this embodiment, the shield electrode 116 has a width about 0.2 μm and respectively has a distance about 0.2 μm to the adjacent pixel electrodes 114.

Figure 13:
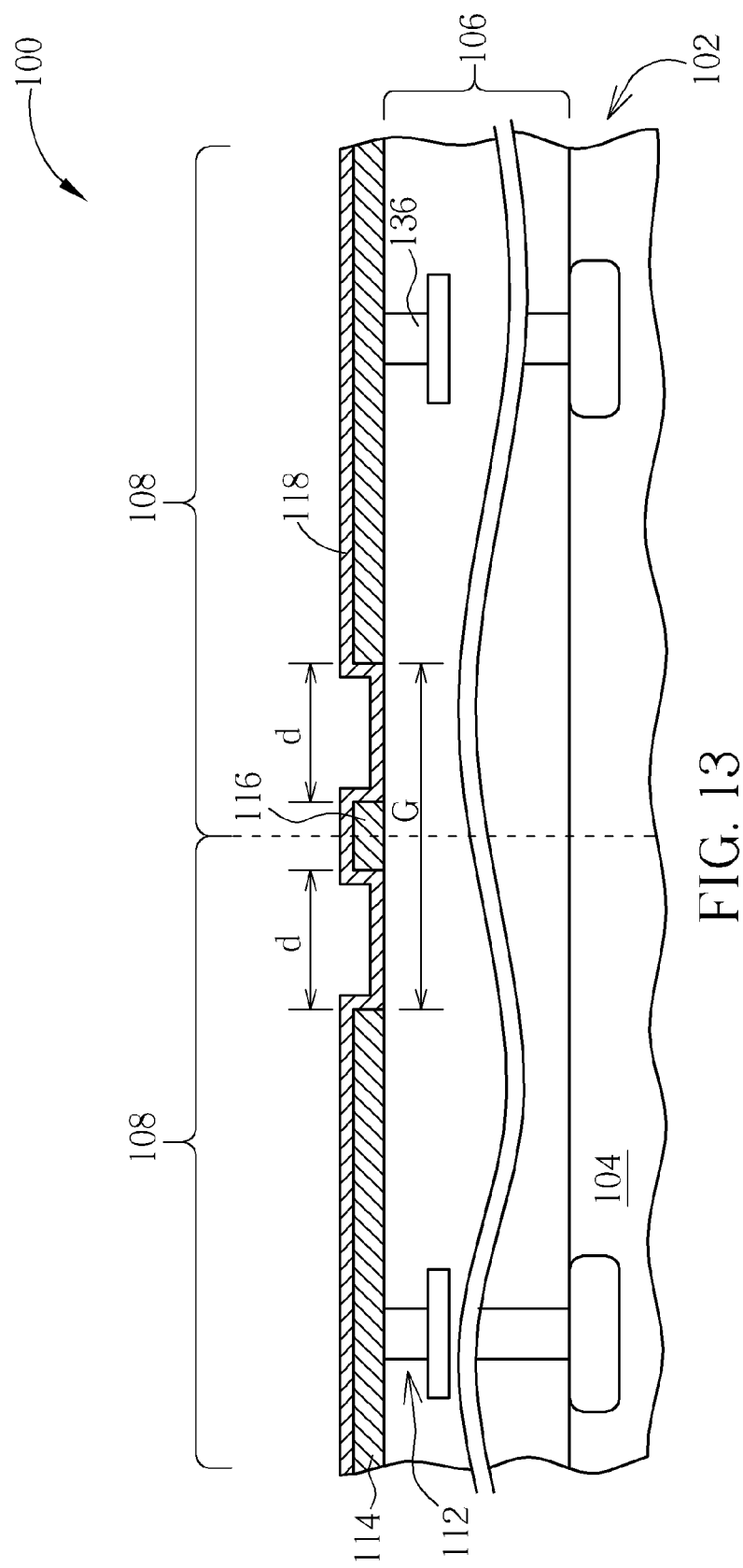
Figure 14:
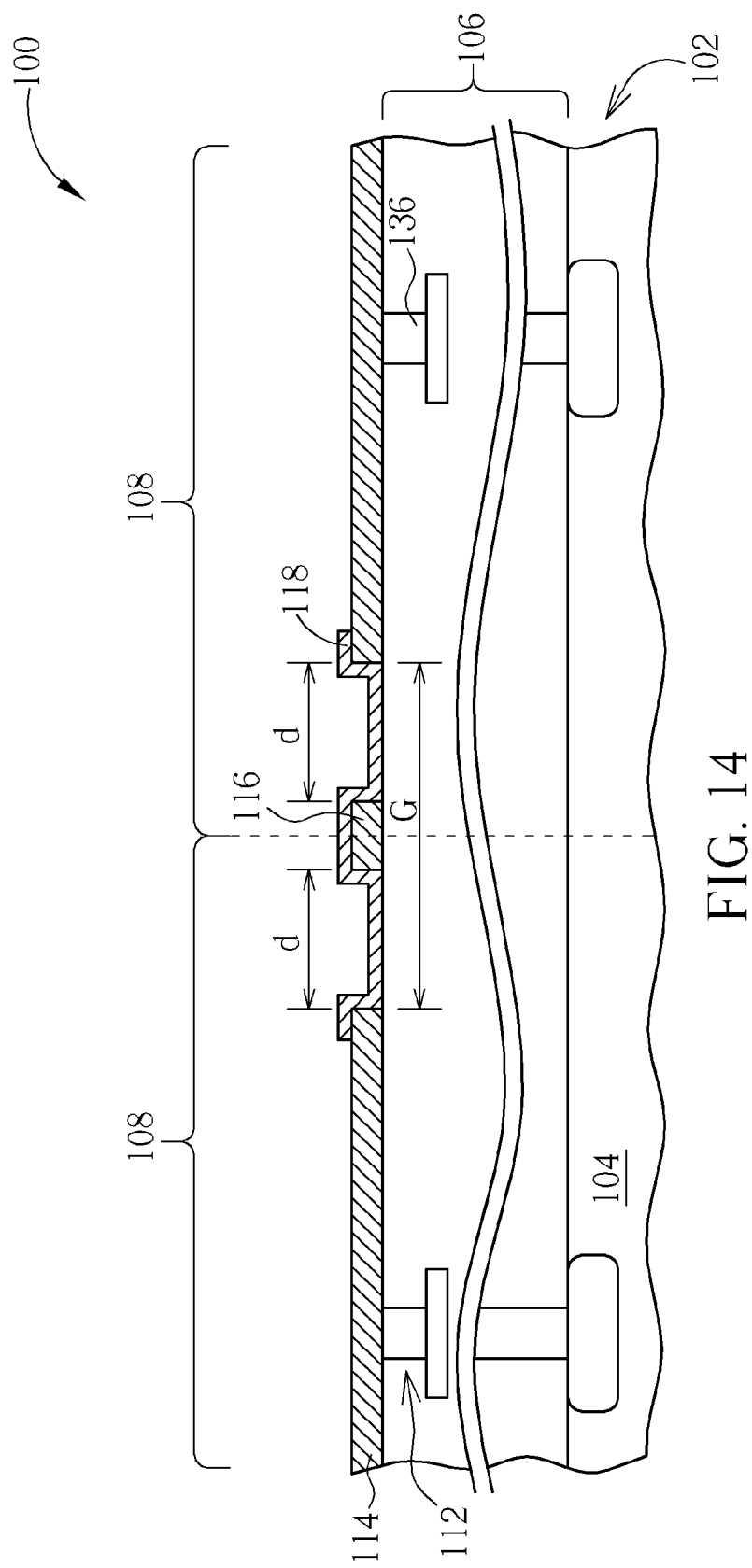
Figure 15:
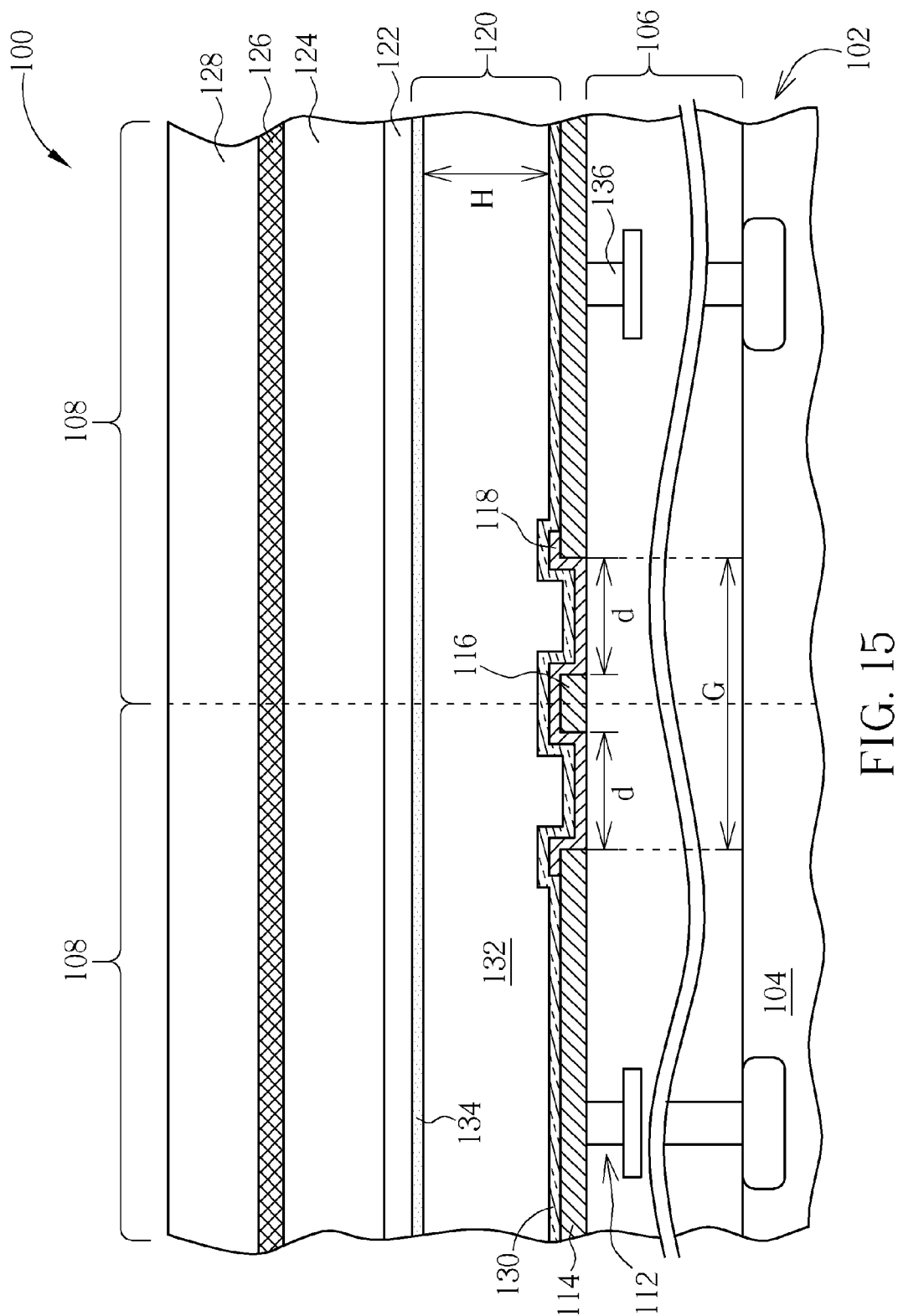

Thereafter, a thin insulating layer 118 is deposited on the substrate 104 to cover the pixel electrodes 114 and the shield electrode 116, as shown in FIG. 13. The insulating layer 118 may comprise insulating materials, such as silicon oxide, and have a thickness about 200 angstroms. Referring to FIG. 14, another photolithography-etching process is performed to remove portions of the insulating layer 118 to expose most portions of the pixel electrodes 114, while the edge portions of the pixel electrodes 114 and the shield electrode 116 between the pixel electrodes 114 are still covered by the insulating layer 118. Sequentially, an α-SiC:H based n-layer 130, an α-Si:H based i-layer 132, and an α-SiC:H based p-layer 134 that form the photo conductive layer 120 are successively formed on the substrate 104, wherein the n-layer 130 are electrically connected to the pixel electrodes 114, and each pixel electrodes 114 are coupled to the corresponding pixel circuits 112 though the via plugs 136. In an embodiment of the present invention, the p-type layer 134 has a thickness about 50 angstroms, the i-layer 132 has a thickness about 5000 angstroms, and the n-layer 130 has a thickness about 100 angstroms. Then, a transparent conductive layer 122 is formed on the photo conductive layer 120. Sequentially, a first planarization layer 124, a color filter layer 126, and a second planarization layer 128 are formed on the transparent conductive layer 122 to finish the fabrication of the image sensor 100, as shown in FIG. 15.

In contrast to the prior, the present invention provides an image sensor structure have a high potential barrier between the pixel electrodes to prevent cross-talk. Furthermore, the insulating layer covering the shield electrode and the edge portions of the pixel electrodes prevents tunneling effect to improve the image lag and dark leakage current problems. Therefore, according to the present invention, an image sensor with good performance may be provided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an image sensor, the method comprising:
   providing a substrate comprising a plurality of pixel circuits thereon, each of the pixel circuits corresponding to a pixel defined on the substrate;
   forming a conductive layer on the substrate;
   performing a first photolithography-etching process (PEP) to remove portions of the conductive layer to form a plurality of pixel electrodes and to form a shield electrode between any two adjacent pixel electrodes, each of the pixel electrodes being positioned in one pixel and electrically connected to the corresponding pixel circuit;
   forming an insulating layer covering the pixel electrodes and the shield electrode;
   performing a second PEP to remove portions of the insulating layer to expose central portions of the pixel electrodes, while edge portions of the pixel electrodes and the shield electrode are still covered by the insulating layer;
   forming a photo conductive layer on the pixel electrodes and the shield electrode; and
   forming a transparent conductive layer covering the photo conductive layer.

2. The method of claim 1, wherein the insulating layer has a thickness about 200 angstroms.

3. The method of claim 1, wherein the insulating layer comprises silicon oxide.

4. The method of claim 1, wherein the shield electrode and the pixel electrodes comprise titanium nitride.

5. The method of claim 1, wherein the shield electrode has the same distances to the two adjacent pixel electrodes.

6. The method of claim 1, wherein the photo conductive layer comprises:
   an n-type layer positioned on the pixel electrodes and the shield electrode;
   an intrinsic layer (i-layer) positioned on the n-type layer; and
   a p-type layer positioned on the i-layer.

7. The method of claim 6, wherein the p-type layer and the n-type layer comprise α-SiC:H material.

8. The method of claim 6, wherein the i-layer comprise α-Si:H materials.

9. The method of claim 6, wherein the i-layer at least has a thickness about 5000 angstroms.

10. The method of claim 9, wherein the i-layer has a thickness about 5000~10000 angstroms.

* * * * *